(12) United States Patent
Pelliciari

(10) Patent No.: US 8,021,482 B2
(45) Date of Patent: Sep. 20, 2011

(54) METHOD FOR ELIMINATING THE PRECIPITATES IN A II-IV SEMICONDUCTOR MATERIAL BY ANNEALING

(75) Inventor: Bernard Pelliciari, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 358 days.

(21) Appl. No.: 11/851,051

(22) Filed: Sep. 6, 2007

(65) Prior Publication Data

US 2008/0060729 A1 Mar. 13, 2008

(30) Foreign Application Priority Data

Sep. 7, 2006 (FR) ...................................... 06 53612

(51) Int. Cl.
*C30B 29/48* (2006.01)

(52) U.S. Cl. .............. 117/89; 117/105; 117/81; 117/83; 117/948

(58) Field of Classification Search .................... 117/89, 117/95, 101, 105, 81–83, 953–958; 427/248.1; 438/558, 909, 971; 257/E21.468
See application file for complete search history.

(56) References Cited

U.S. PATENT DOCUMENTS

| | | | | |
|---|---|---|---|---|
| 3,870,473 A | * | 3/1975 | Kyle | 117/223 |
| 4,012,242 A | * | 3/1977 | Matare | 117/56 |
| 4,190,486 A | * | 2/1980 | Kyle | 438/502 |
| 4,389,256 A | * | 6/1983 | Nishizawa et al. | 438/45 |
| 4,481,044 A | | 11/1984 | Schaake et al. | |
| 4,482,423 A | * | 11/1984 | Besomi et al. | 117/61 |
| 4,740,386 A | * | 4/1988 | Cheung | 117/105 |
| 4,960,721 A | * | 10/1990 | Terashima et al. | 438/796 |
| 5,041,719 A | * | 8/1991 | Harris et al. | 219/390 |
| 5,100,832 A | * | 3/1992 | Kitagawa et al. | 117/108 |
| 5,201,985 A | | 4/1993 | Medvedieff | |

(Continued)

FOREIGN PATENT DOCUMENTS

| | | |
|---|---|---|
| EP | 0 423 463 A1 | 4/1991 |
| JP | 62-087499 * | 4/1987 |

OTHER PUBLICATIONS

H. R. Vydyanath, et al., "Recipe to minimize Te precipitation in CdTe and (Cd, Zn) Te crystals", Journal of Vacuum Science and Technology Part B, XP000296494, vol. 10, No. 4, Jul. 1, 1992, pp. 1476-1484.

(Continued)

*Primary Examiner* — Bob M Kunemund
(74) *Attorney, Agent, or Firm* — Oblon, Spivak, McClelland, Maier & Neustadt, L.L.P.

(57) ABSTRACT

A method for eliminating precipitates contained in an II-VI solid semiconductor material, in which the solid semiconductor material is a congruent sublimation solid semiconductor material, the method including: providing an inert gas flow; heating the solid semiconductor material under the inert gas flow up to a temperature T, between a first temperature $T_1$, corresponding to compound II-VI/element VI eutectic, and a second temperature $T_2$, corresponding to maximum congruent sublimation temperature; maintaining the solid semiconductor material at this temperature T under a neutral gas flow for a time period sufficient to eliminate the precipitates; cooling the solid semiconductor material under the inert gas flow from temperature T to ambient temperature, at a rate such that, during the cooling, the solid semiconductor material merges with its congruent sublimation line; and recovering a precipitate-free solid semiconductor material.

14 Claims, 4 Drawing Sheets

U.S. PATENT DOCUMENTS

| | | | | |
|---|---|---|---|---|
| 5,262,349 A | * | 11/1993 | Yoshida | 438/558 |
| 5,599,733 A | * | 2/1997 | Wan et al. | 438/558 |
| 5,830,269 A | * | 11/1998 | Kawase et al. | 117/83 |
| 5,933,751 A | * | 8/1999 | Hirota | 438/558 |
| 6,299,680 B1 | * | 10/2001 | Koyama et al. | 117/2 |
| 6,340,535 B2 | * | 1/2002 | Namikawa et al. | 428/650 |
| 6,613,162 B1 | * | 9/2003 | Dutta et al. | 148/512 |
| 2003/0073259 A1 | * | 4/2003 | Namikawa | 438/46 |

OTHER PUBLICATIONS

J. H. Greenberg, et al., "P—T—X phase equilibrium and vapor pressure scanning of non-stoichiometry in the Cd—Zn—Te system", Progress in Crystal Growth and Characterization of Materials, XP005010295, vol. 47, No. 2-3, 2003, pp. 196-238.

H. R. Vydyanath, et al., "Thermomigration of Te Precipitates and Improvement of (Cd, Zn) Te Substrate Characteristics for the Fabrication of LWIR (Hg, Cd) Te Photodiodes", Journal of Electronic Materials, vol. 22, No. 8, Jan. 13, 1993, pp. 1073-1080.

Li Yujie, et al., "Reduction of Te-rich phases in $Cd_{1-x}Zn_xTe$ (x=0.04) crystals", Journal of Physics Condens Matter, No. 14, 2002, pp. 10183-10191.

S. Sen, et al., "Infrared Absorption Behavior in CdZn Te Substrates", Journal of Electronic Materials, vol. 30, No. 6, Mar. 1, 2001, pp. 611-618.

* cited by examiner

METHOD FOR ELIMINATING THE PRECIPITATES IN A II-IV SEMICONDUCTOR MATERIAL BY ANNEALING

The invention relates to a method for eliminating the precipitates in a congruent sublimation II-VI semiconductor material, such as CdTe, CdZnTe or ZnTe, by annealing.

Said precipitates generally consist of one of the elements, namely element II, such as Cd or element VI, such as Te.

The technical field of the invention can be defined as that of preparing semiconductor materials and their purification, i.e., the elimination of the defects and impurities of these materials.

One is herein more particularly interested in the preparation and purification of congruent sublimation II-VI semiconductor materials.

One basic question which arises during crystal growth preparation of II-VI semiconductor materials is how to grow ingots from the liquid phase which are free of defects, such as precipitates of one of the constituent elements of the matrix (element II or element VI), or, at the very least, how to reduce the rate of these defects.

The origin of these precipitates is explained thermodynamically by the retrograde appearance of the solidus, which is tracked inevitably during cooling, as shown clearly in FIG. 1.

For example:

1. for CdTe ingots made in the form of a sealed tube, it is seen in the attached diagram of FIG. 1 that, in the vicinity of the congruent melting point (xl=0.50010), the precipitates appear from the moment the solidus is intercepted, i.e., at around 830° C.;

2. for CdTe ingots made in the form of a sealed tube, in tellurium solvent ($x_i^* > 0.50020$), via methods like the Bridgman method, the high-pressure Bridgman method, or the THM method, the tellurium precipitates appear from the moment that the first crystal cools, since the representative point of this first crystal is on the retrograde solidus.

These tellurium precipitates, having a density and size dependent on the cooling kinetics, are considered to be potential sources of particularly troublesome defects during the course subsequent technological steps, such as the growth of epitaxial layers, the production of p-n diodes, the manufacture of X and γ ray detectors, and the manufacture of electro-optical components.

In order to eliminate the precipitates from a material containing them, it is known to anneal this material in order to bring it into its field of existence, the field of existence being the field contained inside its solidus. The condition to be met during this annealing treatment is to not cause the material to cross over its solidus curve during cooling.

Thus, in the case of II-VI semiconductors, in order to eliminate the precipitates from the ingot, which cannot possess any, due to its metallurgy carried out preferably during the liquid phase, it is possible to implement a method consisting in annealing this entire ingot, or each of the wafers extracted from this ingot, to bring the ingot back up to a temperature T, in a sealed tube, and to subject it, at this temperature, to a element II pressure higher than the partial pressure of this element II, above the II-VI material in question, and fabricated on the element VI side (this pressure, however, necessarily remaining lower than the partial pressure of element II, above the II-VI material fabricated on the element II side) see reference [1].

Thus, based on the applied pressure of element II, the composition of this material can be adjusted to any value contained in the field of existence at this temperature. In the case where the stoichiometric composition line is included in the field of existence of the solid, the stoichiometric composition can be attained, as well as the solid compositions beyond the stoichiometric composition, in which case a conductivity-type change is generally observed.

It clearly appears that ingots brought back to the stoichiometric composition can be cooled without ever crossing over the solidus, i.e., without ever producing participates.

Many articles and patents are found in literature which are devoted to the annealing of II-VI materials like CdTe, or CdZnTe, and ZnTe according to this method: [1], [2], [3], [4].

However, the previously described method has numerous flaws and disadvantages, and causes several difficulties:

1. its implementation requires that two temperatures be controlled, namely one for the source containing element II and one for the II-VI material, and these temperatures are not independent;

2. automatic control of the source and of the II-VI material is required so that, at every moment, the pressure of element II is equal to the partial pressure of this element, above the II-VI material;

3. determination of the pressure of element II, corresponding to the stoichiometric point, must be as accurate as possible, and this is true for all of the temperatures at which the II-VI material is annealed;

4. the pressure control for element II, during the annealing phase, is ensured by the accuracy of the temperature control for the source of element II, so that $P_{II} = \overline{P}_{II}$, above the stoichiometric II-VI material;

5. it is only possible to produce it in a sealed tube, which means that it is necessary to use up one quartz tube per anneal.

Therefore, it follows from the preceding that the annealing method, in which an element II pressure is applied above the II-VI material, is complicated to implement, and above all extremely difficult to reproduce in a reliable manner, due in particular to the precise and sensitive adjustments, measurements and controls that it involves.

Therefore, a need exists for an annealing method for eliminating the precipitates in a II-VI solid semiconductor material by annealing, which is simple, reliable, reproducible, easy to implement, economical and which ensures complete elimination of the precipitates.

Another need exists for an annealing method for eliminating the precipitates in a II-VI solid semiconductor material, which does not have the disadvantages, flaws, limitations, drawbacks and difficulties of the annealing methods of the prior art, and which solves the problems of the methods of the prior art.

The purpose of this invention is to provide an annealing method for eliminating the precipitates in an II-VI solid semiconductor material, such as CdTe, CdZnTe or ZnTe, which, among other things, meets these needs.

This purpose and others also are achieved, in accordance with the invention, by a method for eliminating the precipitates contained in an II-VI semiconductor material by annealing, in which said solid semiconductor material is a congruent sublimation solid semiconductor material, and in which the following successive steps are carried out:

the solid semiconductor material is heated under an inert gas flow up to a temperature T, between a first temperature $T_1$, corresponding to the compound II-VI/element VI eutectic, and a second temperature $T_2$, corresponding to the maximum congruent sublimation temperature;

the solid material is held at this temperature T under a neutral gas flow for a time period sufficient to eliminate the precipitates;

the solid semiconductor material is cooled under an inert gas flow from temperature T to ambient temperature, at a rate such that, during cooling, the solid material merges with its congruent sublimation line;

the precipitate-free solid semiconductor material is recovered.

Ambient temperature is understood to mean a temperature of generally 20 to 25° C., e.g., from 21 to 24° C., and in particular from 22 to 23° C.

It could possibly be said that heating under an inert gas flow and/or holding under an inert gas flow and/or cooling can be done without any element II and/or element VI counterpressure. However, it is understood that, although the terms <<without>> counterpressure are used, there is always in fact a certain degree of pressure by elements II and/or VI that is inherent to sublimation. But no measure is implemented for establishing counterpressure, as is the case in the prior art. The only pressure is that which is naturally due, in an inherent way, to sublimation, without having to do anything to ensure it.

The method according to the invention has never been described in the prior art.

The method according to the invention does not have the difficulties, flaws, limitations and drawbacks of the methods of the prior art, and it solves the problems posed by the methods of the prior art, and in particular, contrary to the methods of the prior art, the method according to the invention does not generally require any counterpressure by element II or VI. Accordingly, the measurements and regulations associated with the establishment of this counterpressure are eliminated.

Among other things, the method according to the invention is simple, reliable, easy to implement, reproducible and economic.

In particular, the method according to the invention differs fundamentally from the methods of the prior art, such as those described in the documents U.S. Pat. No. 5,201,985, U.S. Pat. No. 4,190,486, U.S. Pat. No. 4,481,044 and EP-A-0 423 463, in that one works under an inert gas flow. The fact that the method according to the invention is carried out under an inert gas flow, an inert gas scavenging, an inert gas flow sweeping, or, more precisely, in that the growth surface of the material is under inert gas scavenging, sweeping, completely and totally changes the growing and cooling conditions of the material and introduces numerous advantages in comparison with the methods of the prior art.

An inert gas flow such as this can be produced with an open reactor tube, a reactor in which the material is placed, generally inside a crucible, as opposed to the so-called <<closed,>> <<sealed>> tubes of the methods of the prior art, in which an inert gas flow is consequently impossible. Working under an inert gas flow is totally different from working under an ordinary, stationary inert atmosphere without any flow, scavenging, or sweeping.

The advantage of working under an inert gas flow is, in particular, to enable entrainment of the vapours from elements II and VI, such as the tellurium and cadmium escaping and effusing from the material being annealed, e.g., via the opening of a crucible functioning as a Knudsen Cell.

The inert gas flow thus creates a situation of dynamic near-equilibrium above the material, e.g., in the dead volume of the crucible, an engine of sorts for discharging the inclusions and precipitates, e.g., element VI, such as the tellurium initially present in the material, the sample being annealed. The vapours thus entrained are condensed at the cold spot of the reactor tube, as is described further on. The flow rate of inert gas can be easily adapted by those skilled in the art, e.g., it can be from 10 to 1,000 cc/minute, preferably, to 100 to 500 cc/minute under a pressure of 1 atmosphere.

The situation of near-equilibrium, for example, can be diagrammed as described in FIG. 5.

The near-equilibrium within the vessel, the boat, the crucible, is self-adapting, particularly during cooling, since the partial pressures of element VI and element II, such as Cd and Te, adapt to the new temperature by themselves, so as to respect the equilibrium constant.

It is obvious that this can only be done in our configuration and owing to the flow of inert gas.

In the prior art, the research scientist must follow the temperature of the source of element VI, such as Cd (or of element II, such as Te), in order to ensure this equilibrium, which cannot be done with as perfect of a degree of accuracy as in our method.

This is why, in our case, the annealed sample or material perfectly follows and merges with its congruent sublimation line during cooling, and why this step is perfectly reproducible from one experiment to the other, while in the case of the prior art, which uses a closed tube, it is only a matter of a bridging approach, of following this line from a distance, which, moreover, is non-reproducible.

According to the invention, the solution was found, in the phase equilibrium diagram, for eliminating the precipitates which are thermodynamic defects.

It can be said that, according to the invention, and knowing the phase diagram for the II-VI material, it is ensured that the II-VI composite is kept in its field of existence where precipitation cannot occur. For these purposes, the congruent sublimation line is used, by merging with this line, following it perfectly and exactly in order to carry out the anneal. An approach such as this is unanticipated and has never been suggested in the prior art.

In a fundamental way, according to the invention, the congruent sublimation line is not approached closely or followed at a distance, but is merged with perfectly, it is followed exactly. The way in which the congruent sublimation line is used, in accordance with the invention, reliably guarantees being perfectly on this line, and does so during the annealing time, but also and especially during the return to ambient temperature, as was already explained above.

The assurance or guarantee of always being accurately situated, in a reliable manner, on the congruent sublimation line, is linked to the inert gas flow and to the self-adapting near-equilibrium which is established according to the invention.

In the methods of the prior art without any inert gas flow, the congruent sublimation line is only approached closely without succeeding in merging with it. And this simple approach is random and non-reproducible. The method according to the invention is therefore clearly more reliable than those of the prior art.

In the phase diagram for the II-VI semiconductor material, the first temperature $T_1$ is advantageously the temperature corresponding to the intersection of the vertical passing through the maximum melting point of the material (i.e., the highest point of the solidus) and the solidus.

In the phase diagram of the II-VI semiconductor material, the second temperature $T_2$ is advantageously the temperature corresponding to the intersection of the congruent sublimation line and the solidus.

The precipitates are generally precipitates of element VI.

The II-VI semiconductor material is advantageously chosen from amongst CdTe, $Cd_{1-x}Zn_xTe$ where x ranges from 0 to 1, and ZnTe.

As precipitates, these types of materials generally only contain precipitates of tellurium.

If the material is CdTe, the precipitates consisting solely of tellurium, the first temperature $T_1$ is 830° C. and the second temperature $T_2$ is 1040° C.

If the material is ZnTe, the precipitates consisting solely of tellurium, the first temperature $T_1$ is 820° C. and the second temperature $T_2$ is 1240° C.

The time period during which the solid material is held at the single constant temperature T is advantageously from 1 minute to 50 hours, this time period also being capable of being called the <<annealing time>>.

This holding time at the single temperature T, or annealing time, depends on the volume of the material subjected to the method and on the temperature chosen.

To illustrate, in the case of a CdZnTe substrate brought to 1040° C., an annealing time of 5 minutes suffices to purge the substrate of the second phase (namely Te precipitates) that it contains, as shown in the attached figures. One of the advantages of the method of the invention is that the annealing is carried out at a constant single temperature, without any temperature profile and regulating of complex temperatures.

The II-VI semiconductor material processed by the method of the invention may appear in a wide variety of forms, in particular, it may appear in the form of a single substrate or several substrates, each of these substrates being capable of appearing in the form of a block or ingot.

The inert gas is generally chosen from amongst argon and helium.

The II-VI solid semiconductor material may be a material fabricated by a Bridgman method at the maximum melting point or in an element VI solvent, such as Te.

Advantageously, the material is placed inside a crucible designed like a KNUDSEN cell.

Advantageously the method is carried out in an open reactor, tube, which enables a flow of an inert gas and scavenging, sweeping, with an inert gas.

The invention will now be described, in particular in relation with particular embodiments in the following detailed description, given for non-limiting and illustrative purposes, and in relation with the attached drawings, in which.

Figure 1:
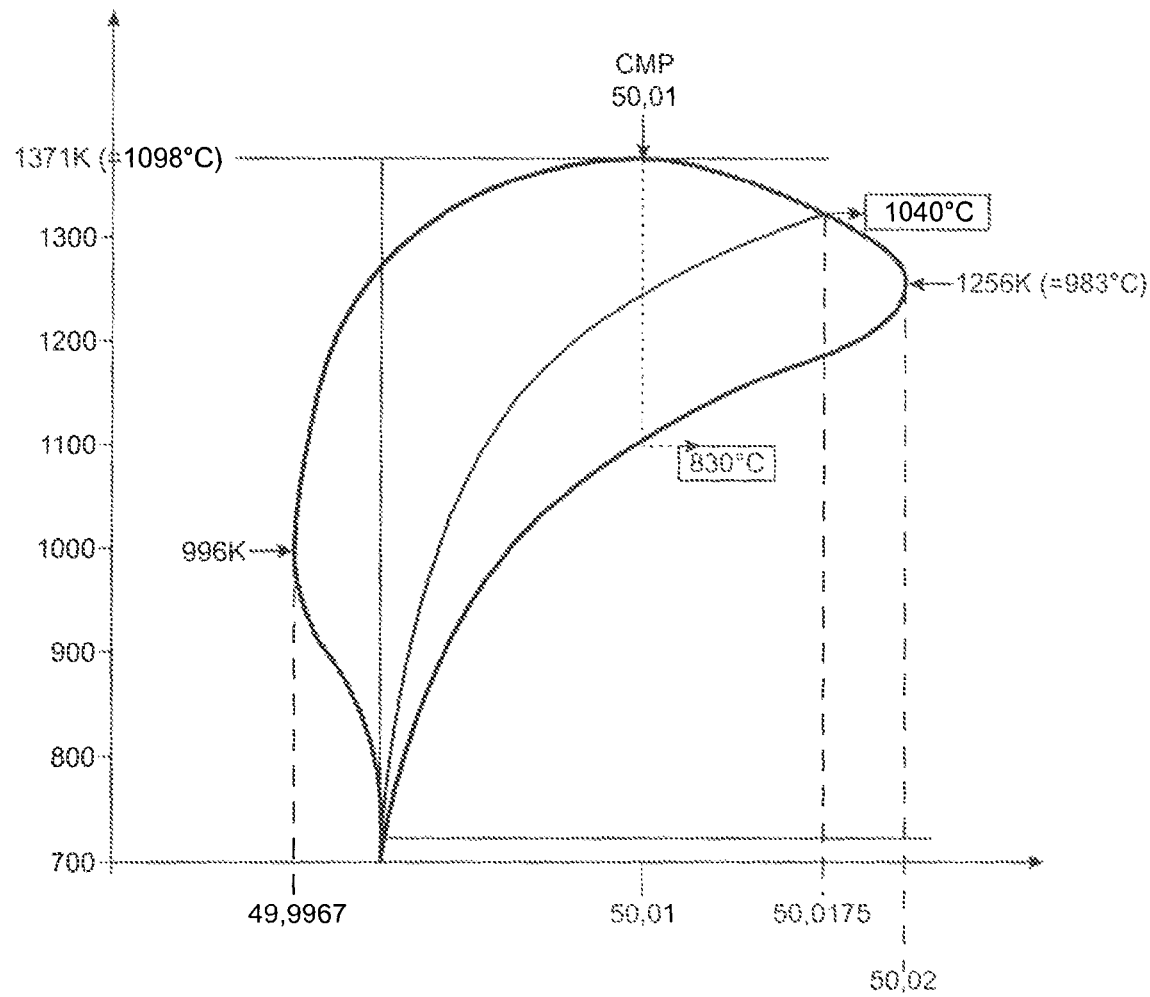
FIG. 1 is the phase diagram for CdTe. The temperature (in K) is plotted along the y-axis and, along the x-axis, is plotted the atomic fraction of tellurium.

The principle upon which the invention is founded, which is based substantially on the phase equilibrium diagram of the phases of solid semiconductor material, is shown in FIG. 1.

FIG. 1 relates to CdTe, but it is quite obvious that the explanations and comments relating to this figure can be easily transposed by those skilled in the art to other congruent sublimation, II-VI semiconductor materials.

Assume, therefore, a CdTe solid fabricated at the maximum melting point or in a tellurium solvent, and containing only tellurium precipitates. This solid is brought back up to a temperature of between 830 and 1040° C.: in the attached diagram (FIG. 1), 830° C. (=1100 K)corresponds to the temperature at which a CdTe produced close to the maximum melting point begins to produce precipitates while it is cooling, and 1040° C. is the solidus temperature at which the congruent sublimation line intercepts the solidus.

If this ingot, brought to a temperature included between these two limits, is placed in an open tube in which an inert gas flows, such as Ar, without any Cd or Te counterpressure, then, regardless of its initial deviation from the stoichiometry, is composition will change, at a constant temperature, so as to become fixed on the congruent sublimation line: in its field of existence, the solid does not contain any precipitate; nothing more is needed then but to cool this solid at a sufficiently slow rate so that, at every moment, it is in equilibrium with its vapour and merges with the congruent sublimation line during cooling. This line, being included in the field of equilibrium, never passes over the solidus line, and makes it possible, at ambient temperature, to recover a precipitate-free solid.

This time, assume a ZnTe solid fabricated in the form of a sealed quartz tube by the Bridgman method, in a tellurium solvent. This solid, which is brought back up to a temperature lower than the temperature where the congruent sublimation line intersects with the solidus (1240° C.), will change in accordance with the method according to the invention, so as to become fixed on the congruent sublimation line: in its field of existence, the solid does not contain any precipitate; nothing more is needed then but to cool this solid at a sufficiently slow rate so that, at every moment, it is in equilibrium with its vapour and merges with the congruent sublimation line during cooling.

Figure 4:
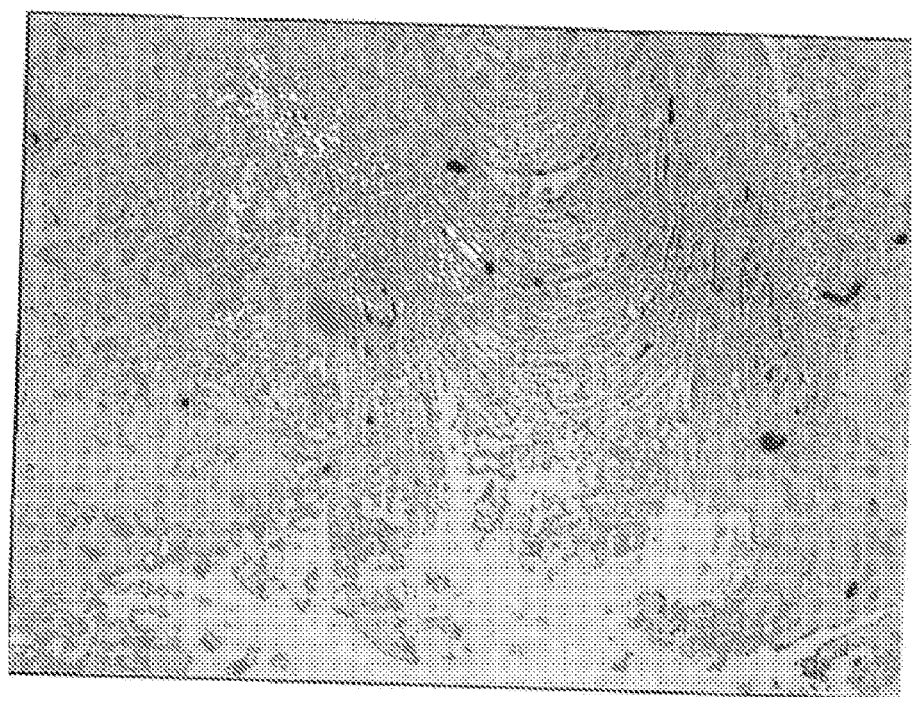
FIG. 4 is an image taken with an optical microscope (magnification 200) of a ZnTe wafer, devoid of any second-phase precipitate, after annealing according to the method of the invention.

In this way once again, a solid free of tellurium precipitates is recovered (see FIG. 4).

Figure 5:
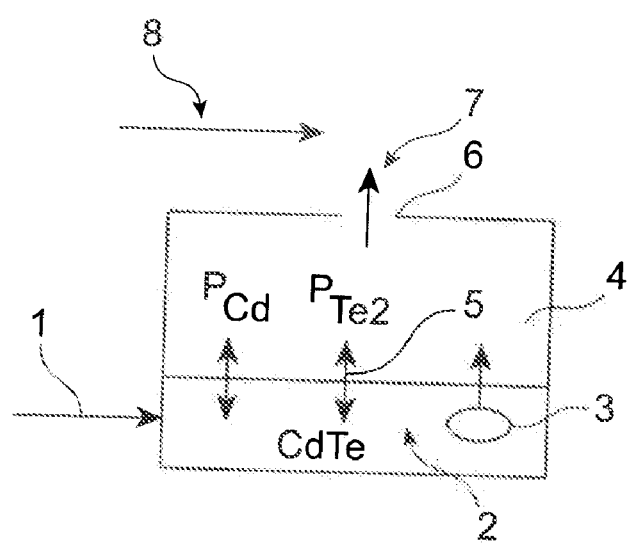
FIG. 5 is a diagrammatic section of a device for implementing the method according to the invention, and shows the principle of this method.

The method according to the invention can be implemented, for example, in the following way, as is described in FIG. 5:

A crucible 1 containing the II-VI semiconductor material 2 is placed inside a quartz tube which is closed at one end and the other end of which can be sealed with a leak-tight end shield. This material 2, for example, can be either a monocrystalline substrate, e.g., CdTe (or CdZnTe), or a block consisting of a single grain extracted from a polycrystalline ingot, e.g., made of CdTe (or CdZnTe), or a monocrystalline ingot, e.g., made of CdTe (or CdZnTe); the shape and dimensions of this crucible are adapted to the shape and dimensions of the sample being annealed.

The II-VI material such as CdTe can include inclusions 3, e.g., of element VI, such as Te. To illustrate, in FIG. 5, it is indicated that the material inside the crucible is CdTe with inclusions of Te.

The material of which the crucible 1 consists is preferably easy to machine, and must have a level of thermal conductivity which promotes isothermicity; graphite, for example, may be perfectly suitable. The crucible is designed to receive the sample and to provide for a sufficient dead volume 4 thereabove to ensure a pseudo-equilibrium (shown the double arrows 5) between the solid being annealed and its vapour phase (PCd and PTe pressures), during the annealing step; the crucible 1 is closed off by an end cap made of the same material as the body of the crucible; this end cap bears a calibrated opening 6 enabling the assembly to function as a Knudsen cell. It is through this opening 6 that the most volatile constituent element of the II-VI material will preferably evaporate (arrow 7).

During the annealing step according to the invention, the quartz tube containing the crucible and sample is introduced into a furnace and brought to the annealing temperature; its end closed off from the exterior of the furnace by the end shield remains at ambient temperature and creates a cold spot, where the vapour escaping from the crucible and entrained by the flow of inert gas, such as argon 8, is condensed.

Figure 2B:
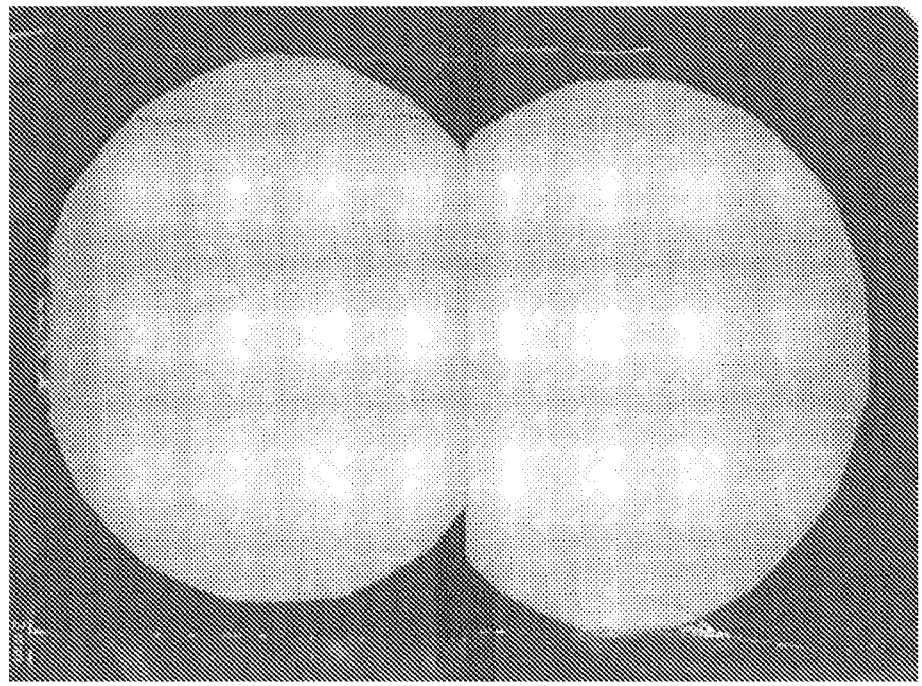
FIG. 2B is an infrared-transmission photograph taken with an IR microscope, which shows the <<mapping>>of the same substrate as that of FIG. 2A, but after annealing, in accordance with the method according to the invention.
Figure 3A:
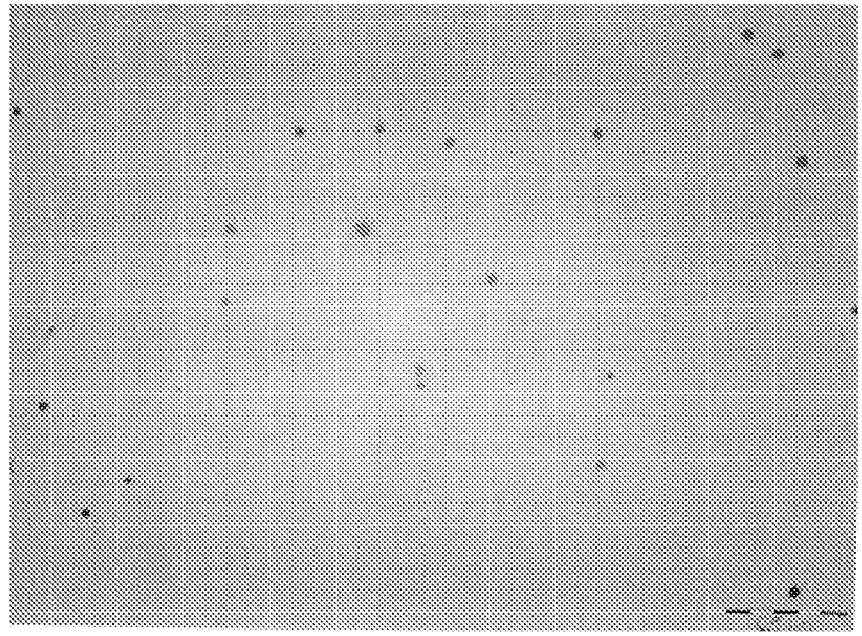
FIG. 3A shows a field of the photograph of FIG. 2A observed at a higher level of magnification (<<zoomed>>), (before practising the invention)
Figure 3B:
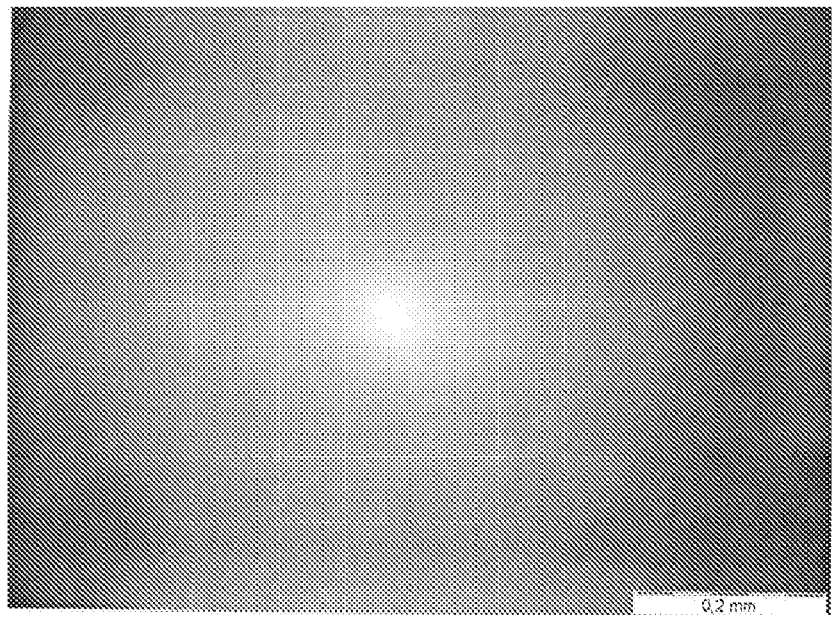
FIG. 3B shows the observed field of the photograph of FIG. 3A (after practising the invention)

As already indicated, the annealing time depends on the volume of the sample being annealed and on the temperature chosen; in the case of a CdZnTe substrate, for example, which is brought to 1040° C., a time period of 5 minutes suffices to purge this substrate of the second phase that it contained, as shown in FIGS. 2B and 3B.

During the course of an anneal according to the method of the invention, the sample being annealed loses material:
- the precipitates and inclusions, e.g., consisting of tellurium, in the case of CdTe, which do not weight heavy,
- the constituent cadmium and tellurium atoms of the crystal lattice (in the case of CdTe), which evaporate in order to establish the partial equilibrium pressures inside the dead volume of the crucible, and in order to maintain them over time, taking into account their leakage through the opening.

The estimated order of magnitude of these losses, for an initial sample of 5 grams, for example, is 1 gram of Cd and Te material lost for a few hundred micrograms of precioitates and inclusions.

This loss of material degrades the initially polished surface appearance, and, after annealing, a very light re-polishing restores the initial appearance.

The invention will now be described, in reference to the following examples, given for non-limiting and illustrative purposes.

EXAMPLE 1

In this example, the tellurium precipitates are eliminated from a solid semiconductor material by the method according to the invention.

The starting material is a CdTe solid fabricated at the maximum melting point.

The monocrystalline substrate having dimensions of 36 by 38 mm$^2$ and a thickness of 750 μm, is oriented along the axis [111]. Its surfaces are mirror-finished according to the customary procedure; they are next pickled in a methanol solution containing 5% bromine, just before the substrate is loaded into the appropriate graphite crucible. The latter is then closed by a lid equipped with a calibrated hole (2 mm diameter). This semi-closed crucible is introduced into the annealing reactor, consisting of a quartz tube the opening of which is sealed with a leak-tight end shield.

A thermocouple is positioned inside the graphite crucible, closest to the substrate. The quartz reactor is then placed under vacuum, and then filled with argon at a pressure of 1 atmosphere. The reactor is subsequently held under argon scavenging, at the rate of 100 cc/minute, and under a pressure of 1 atmosphere.

The furnace in which the quartz tube is installed is then heated and follows an annealing schedule imposed by the research scientist in order to reach the temperature of 1040° C., at the rate of 250° C./hour. It remains at this temperature for 5 minutes, before returning to ambient temperature at the rate of 40° C./hour.

At ambient temperature, the epitaxy substrate is removed from the crucible and is characterised by IR-transmission microscopy, after light polishing made necessary following evaporation that occurred during the annealing phase.

Figure 2A:
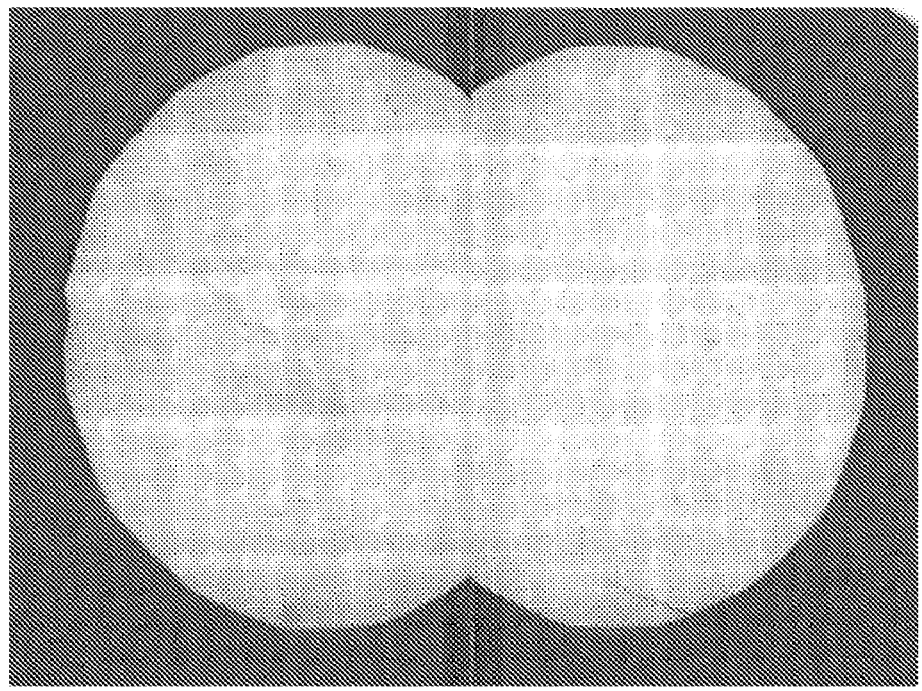
FIG. 2A is an infrared-transmission photograph taken with an IR microscope, which shows the <<mapping>> of an as-grown CdTe substrate derived from an ingot produced from a liquid having a composition close to that of the maximum melting point.

In FIG. 2A, which shows the <<mapping>> of the as-grown substrate, produced by IR transmission using a microscope, it is observed that the fields of this mapping have black spots characteristic of the presence of a second phase.

A field observed at a higher level of magnification (FIG. 3A) accurately shows the shape, size and distribution of these black spots of the second phase.

FIG. 2B shows the mapping of the same substrate after annealing according to the method of the invention, a mapping produced with an infrared-transmission microscope. Black spots corresponding to a second phase at ambient temperature are no longer observed. This is confirmed by the photograph produced at a higher level of magnitude (FIG. 3B).

EXAMPLE 2

In this example, the same experiment is conducted as in Example 1 (with the same conditions), with a monocrystalline $Cd_xZn_{1-x}Te$ substrate where x=0.4: the same results were obtained.

EXAMPLE 3

In this example, the precipitates are eliminated from a ZnTe solid fabricated in a sealed quartz tube by the Bridgman method using a tellurium solvent and containing only tellurium precipitates.

A monocrystalline substrate of [111] orientation having dimensions of 10 by 10 mm$^2$ and a thickness of 350 μm is processed in the same way as the preceding CdTe; it is introduced into a graphite crucible similar to the one used for the CdTe, which is positioned inside the reactor scavenged by the argon flow, at a rate of 100 cc/minute, under a pressure of 1 atmosphere.

In order to take account of the specific diagram for ZnTe, the annealing temperature can be chosen within the range of 449.5° C. to 1240° C. (maximum congruent evaporation temperature or the temperature at which the congruent evaporation line intercepts the solidus), according to the invention.

For this anneal, the temperature is 1010° C. for 5 minutes. The return to ambient temperature occurs at the rate of 40° C./hour.

Visible microscopic observation can be made directly in transmission, the ZnTe being transparent to these wavelengths and its surface being degraded during the annealing phase.

FIG. 4 shows an image in transmission, taken with an optical microscope (magnification 200), of a ZnTe wafer devoid of any second phase, after an anneal according to the method of the invention.

REFERENCES

[1] U.S. Pat. No. 6,299,680
[2] H. R. Vydyanath, J. A. Ellsworth, J. B. Parkinson, <<Thermomigration of Te Precipitates and Improvement of (Cd, Zn)Te Substrate Characteristics for the Fabrication of LWIR (Hg,CD)Te Photodiodes>>, Journal of Electronics Materials, vol. 22, No. 8, 1993

[3] Li Yujie and Jie Wanqi, <<Reduction of Te-rich phases in $Cd_{1-x}Zn_xTe$ (x=0.04) crystals>>, J. Phys. Condens. Matter 14 (2002) 10183-10191

[4] S. Sen, D. R. Rhiger, C. R. Curtis, M. H. Kalisher, H. L. Hettich and M. C. Currie, <<Infrared Absorption Behavior in CdZnTe Substrates>>, Journal of Electronic Materials, vol. 30, No. 6, 2001

The invention claimed is:

1. A method for eliminating precipitates contained in an II-VI solid semiconductor material, in which said solid semiconductor material is a congruent sublimation solid semiconductor material, the method comprising:
   providing an inert gas flow;
   heating the solid semiconductor material under the inert gas flow up to a temperature T, between a first temperature $T_1$, corresponding to compound II-VI/element VI eutectic, and a second temperature $T_2$, corresponding to maximum congruent sublimation temperature;
   maintaining the solid semiconductor material at this temperature T under the inert gas flow for a time period sufficient to eliminate the precipitates;
   cooling the solid semiconductor material under the inert gas flow from temperature T to ambient temperature, at a rate such that, during the cooling, the solid semiconductor material merges with its congruent sublimation line; and
   recovering a precipitate-free solid semiconductor material.

2. The method of claim 1, wherein, in a phase diagram for the II-VI semiconductor material, the first temperature $T_1$ is a temperature corresponding to the intersection of the vertical passing through a maximum melting point of the II-VI semiconductor material and solidus.

3. The method according to claim 1, wherein, in a phase diagram for the II-VI semiconductor material, the second temperature $T_2$ is a temperature corresponding to an intersection of congruent sublimation line and solidus.

4. The method according to claim 1, wherein the precipitates are precipitates of element VI.

5. The method according to claim 1, wherein the II-VI semiconductor material is one of CdTe, $Cd_{1-x}Zn_xTe$ where x ranges from 0 to 1, and ZnTe.

6. The method of claim 5, wherein the precipitates included in the II-VI semiconductor material are only tellurium precipitates.

7. The method according to claim 1, wherein the semiconductor material is CdTe, the precipitates consist solely of tellurium, the first temperature $T_1$ is 830° C. and the second temperature $T_2$ is 1040° C.

8. The method according to claim 1, wherein the semiconductor material is ZnTe, the precipitates consist solely of tellurium, the first temperature is $T_1$ is 820° C. and the second temperature $T_2$ is 1240° C.

9. The method according to claim 1, wherein the maintaining includes maintaining the temperature T for a time period of 1 min to 50 hours.

10. The method according to claim 1, wherein the semiconductor material includes one or more substrates, each of the one or more substrates being in a form of a block or ingot.

11. The method of claim 1, wherein the providing includes providing argon or helium.

12. The method according to claim 1, wherein the solid semiconductor material is a material fabricated by a Bridgman method at a maximum melting point, or in an element VI solvent.

13. The method according to claim 1, further comprising:
   disposing the semiconductor material inside a Knudsen cell.

14. The method according to claim 1, further comprising:
   disposing the solid semiconducting material in an open reactor,
   wherein the providing the inert gas flow includes providing the inert gas at the open reactor, and
   the heating includes heating the solid semiconductor material in the open reactor.

* * * * *